(12) United States Patent
Letzel et al.

(10) Patent No.: US 6,539,760 B1
(45) Date of Patent: Apr. 1, 2003

(54) MONITORING DEVICE

(75) Inventors: Helmut Letzel, Köln (DE); Uwe Franke, Wuppertal (DE)

(73) Assignee: K.A. Schmersal GmbH & Co., Wuppertal (DE)

( * ) Notice: Subject to any disclaimer, the term of this patent is extended or adjusted under 35 U.S.C. 154(b) by 56 days.

(21) Appl. No.: 09/652,705

(22) Filed: Aug. 31, 2000

Related U.S. Application Data

(63) Continuation-in-part of application No. 09/317,338, filed on May 24, 1999, now Pat. No. 6,283,514.

(30) Foreign Application Priority Data

Jul. 22, 1999 (DE) .......................................... 199 34 370

(51) Int. Cl.⁷ .............................................. E05B 47/00
(52) U.S. Cl. ..................... 70/276; 70/278.1; 200/43.01; 292/348.16
(58) Field of Search ....................... 70/276, 277, 278.1, 70/DIG. 42; 292/142, 139, 160, 172, 181, 254, 348.16, DIG. 62, DIG. 65; 200/43.01, 43.03, 43.16

(56) References Cited

U.S. PATENT DOCUMENTS

| | | | | |
|---|---|---|---|---|
| 3,638,461 A | * | 2/1972 | Watson ........................... | 70/92 |
| 3,810,145 A | | 5/1974 | Gusaras ......................... | 340/274 |
| 4,563,886 A | * | 1/1986 | Kletzmaier et al. ........ | 70/277 X |
| 4,685,709 A | * | 8/1987 | Kambic ..................... | 70/279 X |
| 4,695,684 A | * | 9/1987 | Bochard et al. ........... | 200/43.07 |
| 4,758,697 A | * | 7/1988 | Jeuneu .................. | 200/43.01 X |
| 5,463,196 A | * | 10/1995 | Darimont ................... | 200/43.16 |
| 5,488,207 A | * | 1/1996 | Niwa et al. ............... | 200/43.04 |
| 5,584,378 A | * | 12/1996 | Wecke et al. ............. | 200/43.04 |
| 5,598,323 A | * | 1/1997 | Muller ................. | 200/43.01 X |
| 5,609,244 A | * | 3/1997 | Reiter ..................... | 200/43.11 |
| 6,140,897 A | * | 10/2000 | Mueller et al. ......... | 200/43.5 X |
| 6,223,571 B1 | * | 5/2001 | Rector ........................... | 70/276 |
| 6,227,019 B1 | * | 5/2001 | Chhatwal ............... | 70/278.1 X |
| 6,247,343 B1 | * | 6/2001 | Weiss et al. ................... | 79/277 |
| 6,259,352 B1 | * | 7/2001 | Yulkowski et al. ....... | 70/277 X |
| 6,283,514 B1 | * | 9/2001 | Letzel ................. | 200/43.01 X |
| 6,345,522 B1 | * | 2/2002 | Stillwagon et al. ........... | 70/277 |
| 6,347,486 B1 | * | 2/2002 | Badillet ................ | 70/278.1 X |
| 6,351,977 B1 | * | 3/2002 | Pedroso et al. ........... | 70/277 X |

FOREIGN PATENT DOCUMENTS

| | | |
|---|---|---|
| DE | 197 11 588 A 1 | 9/1998 |
| EP | 0 825 628 A1 | 2/1998 |
| WO | WO 85/03970 | 9/1985 |

OTHER PUBLICATIONS

EP Search Report EP 00115205.

* cited by examiner

*Primary Examiner*—Suzanne Dino Barrett
(74) *Attorney, Agent, or Firm*—Alix, Yale & Ristas, LLP

(57) ABSTRACT

A monitoring device for a protected area of a machinery installation, the area being accessible through at least one access opening which can be closed off by an element, such as a door, shutter, or the like, which is movable between an open position and a closed position. The monitoring device being arranged adjacent to the movable element and comprising a safety switch having a housing, an evaluation device, a movable element positionable between a closed and an open position, a coded release mechanism located on the movable element, and a read head for reading the coded release mechanism when the movable element is in the closed position. The safety switch being further provided with an actuator bearing a release mechanism, and which, in a locking position in the housing, locks the movable element in its closed position. The housing having a receiving space for the actuator such that the release mechanism is located adjacent to the read head when the actuator is in the locking position in the housing. The actuator being movable in relation to the movable element by coupling to a handle provided on the movable element.

18 Claims, 5 Drawing Sheets

MONITORING DEVICE

This is a continuation-in-part of Ser. No. 09/317,338 filed May 24, 1999 now U.S. Pat. No. 6,283,514.

FIELD OF THE INVENTION

The invention relates to a monitoring device for protected areas which are to be monitored, for example of machines or machinery installations, of which the access doors or openings are provided with a safety-switch device in order to prevent unauthorized access into hazardous areas with operating machinery such as robots or the like.

BACKGROUND OF THE INVENTION

From German Laid-Open Patent Application DE 19711 588 A1 a monitoring device is known, in which there is provided a conventional safety switch which can be actuated by a key-like actuator which, for its part, is fastened on a door or the like. The door itself can be opened and closed via a separate handle. In this case, the actuator is merely screwed to the door and can thus also be removed in a straightforward manner. However, this results in it being possible for the safety switch to be actuated by the detached actuator, with the door open, and thus for the safety switch to be outsmarted.

Moreover, U.S. Continuation In Part patent application Ser. No. 09/317,338 dated May 24, 1999 (EP 0 825 628 A), incorporated herein by reference, discloses a monitoring device in which there is provided at least one safety switch which can be actuated via a key-like actuator. In this case, the actuator, with the door in the closed state, can be displaced longitudinally by means of a door handle and a toothed-ring segment, which is in engagement with a rack section of the actuator, into the housing of the safety switch in order to actuate the latter mechanically.

SUMMARY OF THE INVENTION

It is an object of the invention to provide a monitoring device of which the safety switch, in addition to allowing the contactless release and mechanical locking thereof, allows actuation, in practice, only when the movable element is closed.

Thus, according to the invention there is provided a monitoring device for a protected area of a machinery installation, the area being accessible via at least one access opening which can be closed off via an element movable between an open position and a closed position and is in the form of a door, shutter or the like; comprising a safety switch provided with a housing, connected to an evaluation device and arranged adjacent to the movable element, said safety switch being further provided with a read head for reading, in the closed position of the movable element, data stored in a coded release mechanism located on the movable element; said movable element being provided with an actuator which, in its end position in the housing, locks the movable element in its closed position and which bears the release mechanism, while the housing has a receiving space for the actuator and receives the read head in a position in which, in the end position of the actuator in the housing, it is located adjacent to the release mechanism, wherein the actuator is movable in relation to the movable element by coupling to a handle provided on the movable element.

Further objects, advantages and embodiments of the invention will become apparent from the following description and the claims.

BRIEF DESCRIPTION OF THE DRAWINGS

The invention is explained in more detail hereinbelow with reference to exemplary embodiments illustrated schematically in the attached drawings.

DETAILED DESCRIPTION OF PREFERRED EMBODIMENTS

Figure 1:
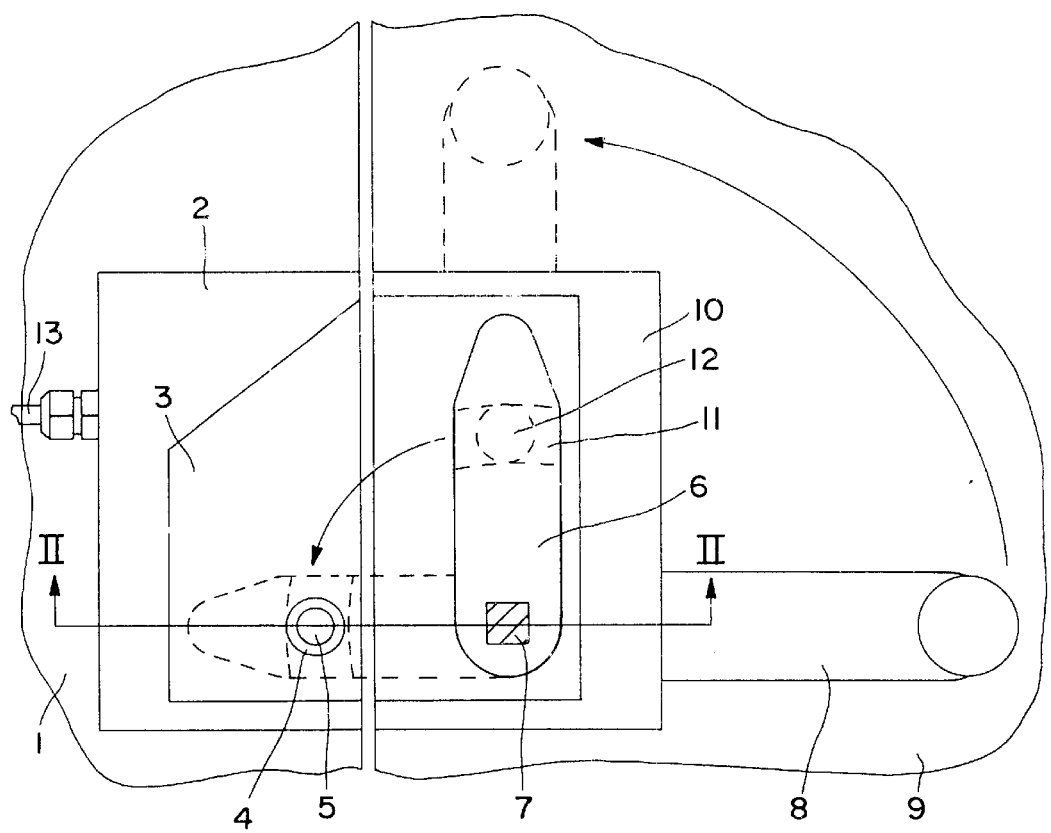
FIG. 1 is a schematic, sectional view of a first embodiment of a safety switch in accordance with the invention.
Figure 2:
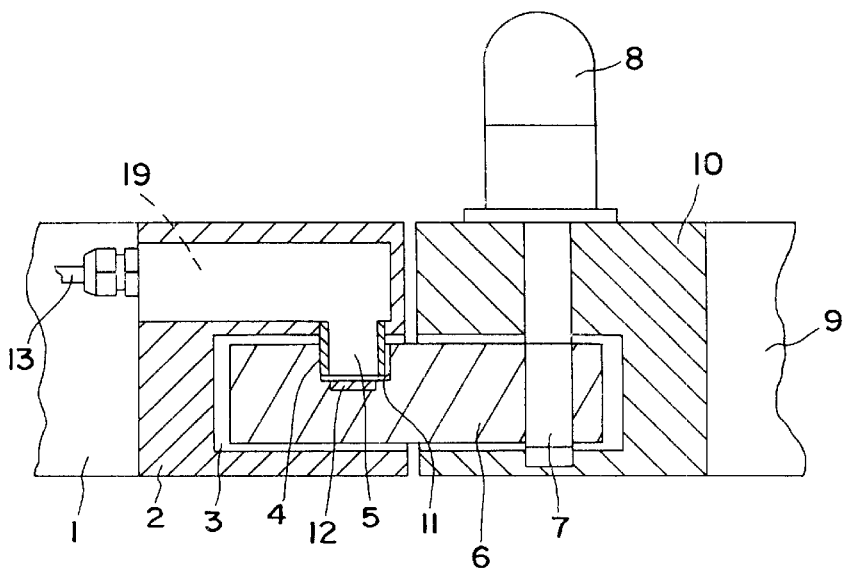
FIG. 2 is a cross-sectional view taken along line I—I of FIG. 1, illustrating the actuator and handle in the locking position.

The safety switch illustrated in FIGS. 1 and 2 comprises a first housing 2 which is fastened on a fixed protective means 1 and has a receiving space 3 in which there is arranged a locking pin 4 which bears a read head 5. The safety switch also comprises an actuator 6 which is coupled, via a pin 7, to a handle 8 of a movable element 9 for example in the form of a door (sliding or swivelling door, hinges provided in the latter case not illustrated). In its unlocking position (FIG. 1), the actuator 6 is received by a second housing 10 fastened on the element 9 and can be pivoted through an angle of approximately 90° by means of the handle 8 (illustrated by dashed and solid lines in FIG. 1). The actuator 6 has a groove 11 which is curved about the axis of the pin 7 and is intended for receiving the locking pin 4 in the locking position of the actuator 6 (dashed lines in FIG. 1).

In the embodiment illustrated, the actuator 6 bears a specifically coded release mechanism 12 (transponder) which is arranged on the base of the groove 11 such that, in the locking position of the actuator 6, the release mechanism 12 is located opposite the read head 5 of the locking pin 4, with the result that the read head can inductively supply energy to the release mechanism 12 and can read the data of the release mechanism 12.

It is also possible, however, for the read head 5 and release mechanism 12 to be arranged opposite one another at other locations in the closed position of the actuator 6, for example with the release mechanism 12 in the tip of the actuator 6 and the read head 5 adjacent to the receiving space 3 in a corresponding position.

In the embodiment illustrated in FIGS. 1 and 2, the read head 5 is connected, via a cable 13, to an evaluation device, which is not illustrated here but may also be integrated in the first housing 2.

Figure 9:
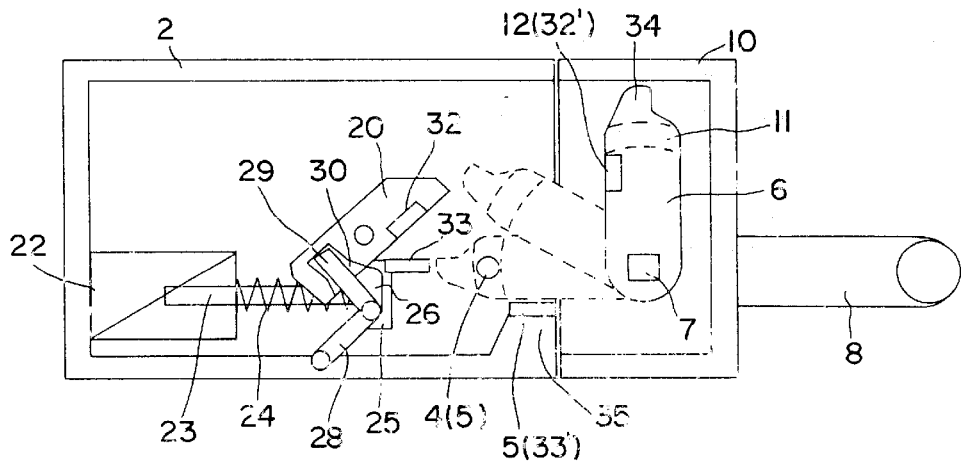
FIG. 9 is a schematic, sectional view of a third embodiment of a safety switch in accordance with the invention, showing the safety switch in the unlocking position.

As already illustrated in FIG. 9 of EP 0 825 628 A, the fixed protective means 1 encloses an area which can be closed off and accessed on foot, for example, and has a machinery installation, for example a robotized production installation. The area is accessible via at least one door or the like as movable element 9, the position of the door being monitored via the safety switch. The latter is coupled to a control means, which is also coupled to the machinery installation in order to release or to block the safety switch in accordance with the operating state of the machinery installation. If a standstill of the movable parts of the machinery installation is signaled to the control 2 means, the latter releases the safety switch, with the result that the area enclosed by the protective means 1 is accessible by virtue of the at least one door being opened. If at least part of the machinery installation is not at a standstill and could put the staff at risk, the safety switch is blocked, with the result that the doors cannot be opened from the outside. Moreover, if at least one door is open, the control means prevents the machinery installation from being started up.

Figure 3:
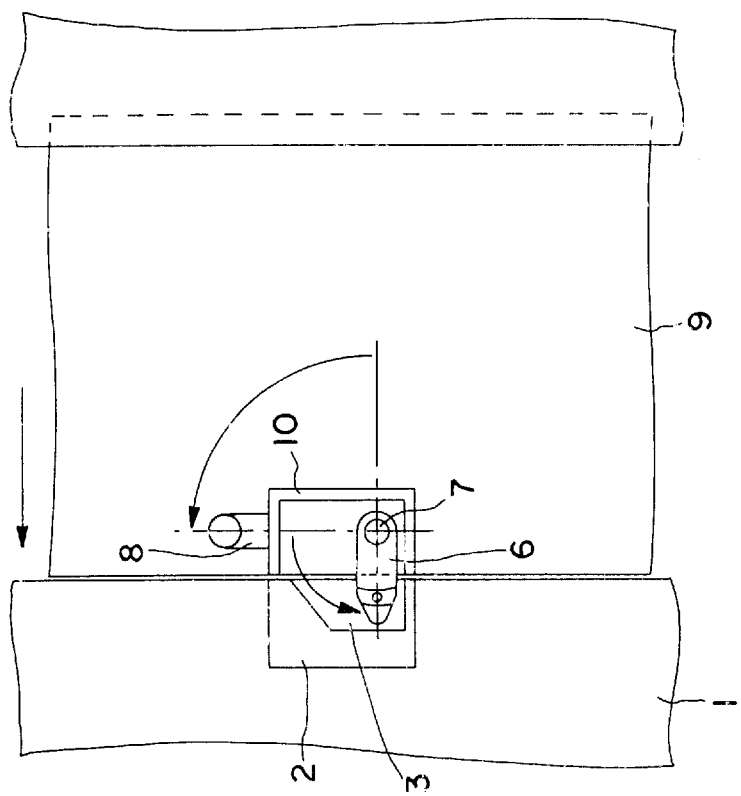
FIG. 3 is a schematic, sectional view of the safety switch of FIG. 1, showing the safety switch installed and in the unlocking position.
Figure 4:
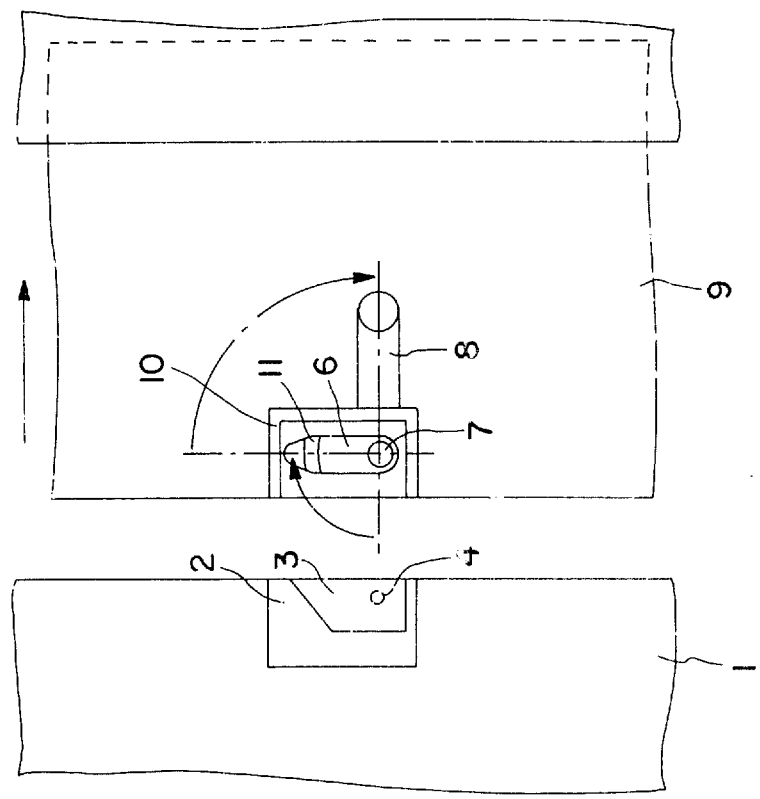
FIG. 4 is a schematic, sectional view of the safety switch of FIG. 3, showing the safety switch in the locking position.

The safety switch illustrated in FIGS. 1 and 2 is illustrated in FIGS. 3 and 4 for the case of an open and closed and locked element 9 in the form of a swivelling or sliding door.

Figure 6:
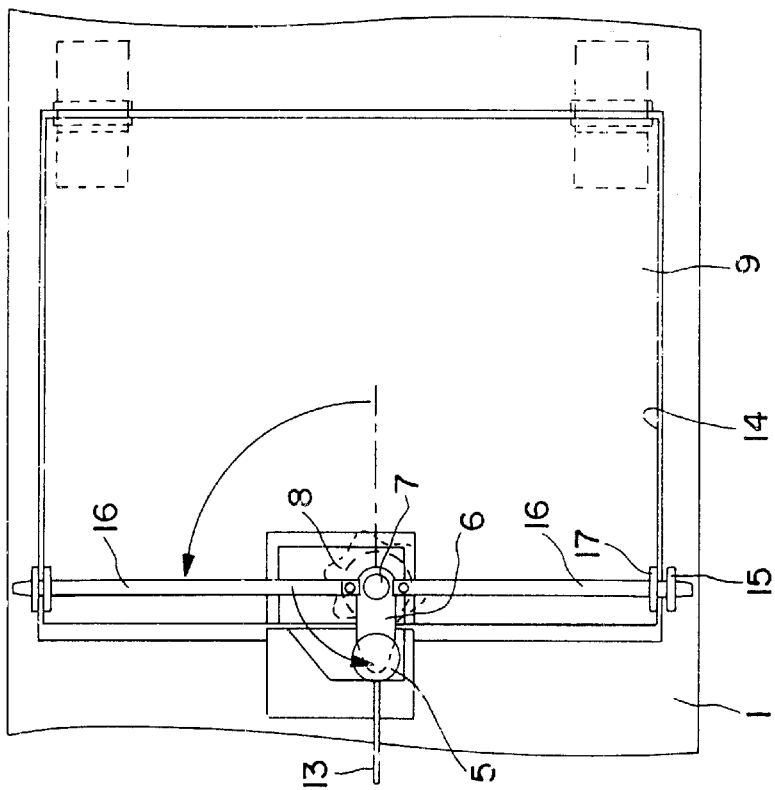
FIG. 6 is a schematic, sectional view of the safety switch of FIG. 5, showing the safety switch in the locking position.
Figure 5:
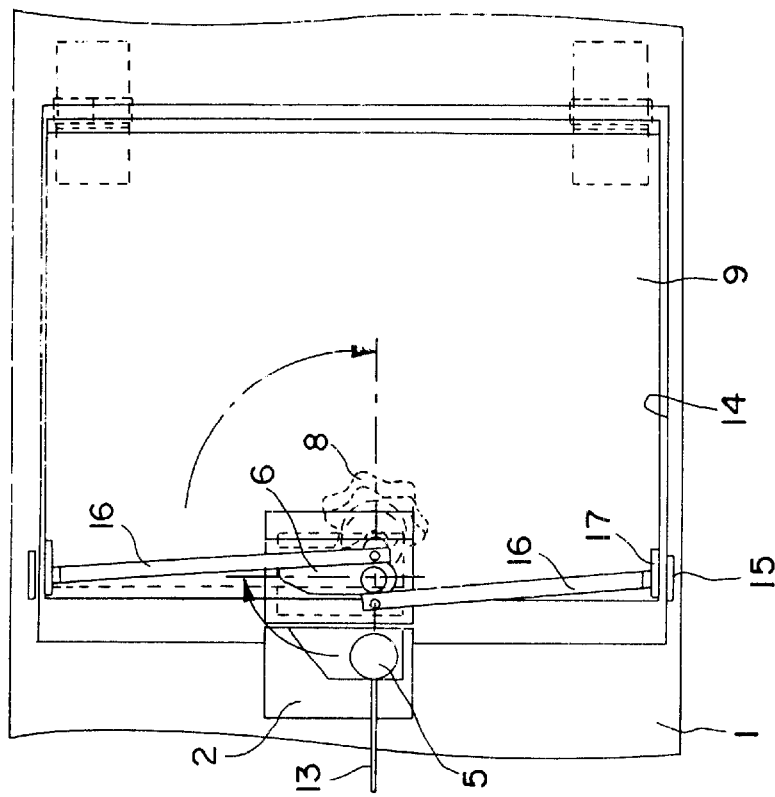
FIG. 5 is a schematic, sectional view of an alternate embodiment of the safety switch of FIG. 1, showing the safety switch installed and in the unlocking position.

In FIGS. 5 and 6, the protective means 1 is provided, above and beneath an opening 14, which can be closed off by the element 9 designed in the form of an articulated shutter or door, with a receiving opening 15 for in each case one locking rod 16 in each case on the side located opposite the side of articulation, the locking rods 16 being articulated adjacent to the actuator 6 and, in the closed position of the element 9, being guided via guide eyelets 17 adjacent to the receiving openings 15, with the result that, upon actuation of the handle 8, designed as a turning knob, in the closed position of the element 9, said locking rods come into engagement with the receiving openings 15 in order to lock the element 9 in relation to the protective means. In this case, the safety switch does not necessarily require the locking pin 4 and the actuator 6 does not necessarily require the groove 11. It is possible for the read head 5 to be arranged in a wall adjacent to the receiving space 3 and for the release mechanism 12 to be arranged in the front end of the actuator 6.

Figure 7:
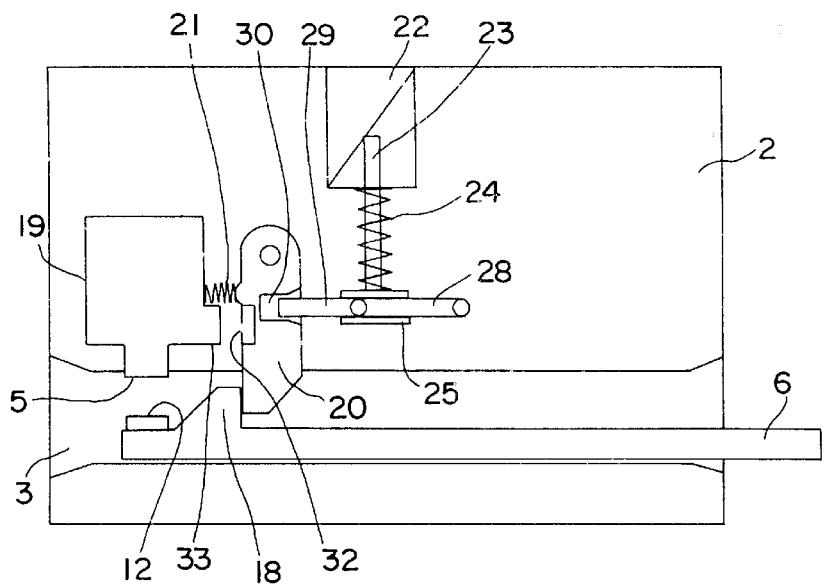
FIG. 7 is a schematic, sectional view of a second embodiment of a safety switch in accordance with the invention, showing the safety switch in the locking position.
Figure 8:
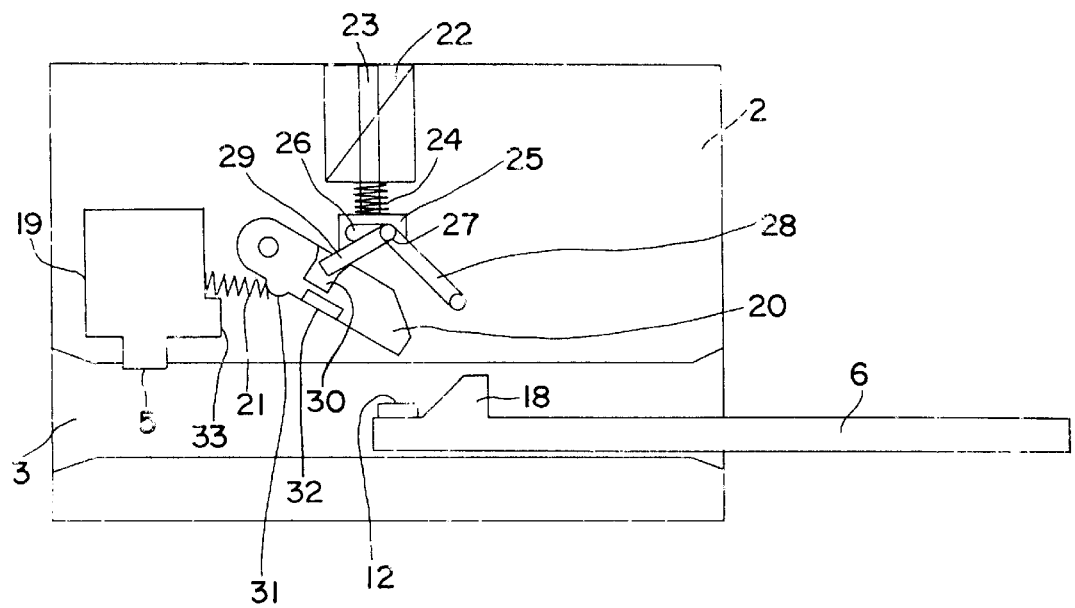
FIG. 8 is a schematic, sectional view of the safety switch of FIG. 7, showing the safety switch in the unlocking position.

In the embodiment illustrated schematically in FIGS. 7 and 8, the actuator 6 (described, for example, as in EP 0825 628 A) can be displaced longitudinally and is provided with a hook-like extension 18 adjacent to its free end, which bears the release mechanism 12. The first housing 2, which has a receiving space 3, designed as a push-in channel, for the actuator 6, receives an evaluation device 19 which bears the read head 5. Also arranged in the first housing 2 is a pivotable locking bar 20 which is biased, by means of a compression spring 21, into its position in which it releases the actuator 6. The locking bar 20 can be actuated via an electromagnet 22, of which the armature 23 can be extended, under the action of a compression spring 24, when the electromagnet 22 is de-energized and can be retracted counter to the force of the compression spring 24, when the electromagnet is energized. At its free end, the armature 23 bears a receiving element 25 which has a slot 26 extending in the direction of the longitudinal axis of the actuator 6. Said slot receives an articulation 27 of two levers 28, 29, which are coupled to one another thereby and of which one is additionally articulated on the first housing 2, while the other, via an engagement opening 30, is in engagement with the locking bar 20 in a displaceable manner in said opening.

If the read head 5 establishes adjacent to it the presence of the correctly coded release mechanism 12, this energizes the electromagnet 22 and the armature 23 thereof is thus extended, as a result of which, in turn, the locking bar 20 is pivoted into its locking position, in which it drops in behind the extension 18 of the actuator 6, with the result that the actuator 6 can only be drawn out of the first housing 2 if the electromagnet 22 has been de-energized and thus, on account of the returning compression spring 24, passes back into its starting position, in which it releases the actuator 6.

The locking bar 20 has a nose 31 for supporting the compression spring 24 otherwise supported on the first housing 2.

In this case, the actuator 6 can also be moved to the locking position when the locking bar 20 is located in the locking position. In this case, the oblique surface of the extension 18, which is at the front in the push-in direction, moves against a corresponding oblique surface on the locking bar 20 and rotates the same counter to the force of the compression spring 24 until the extension 18 has moved beneath the locking bar 20, with the result that the locking bar 20 can then drop in behind the extension 18. This means that the electromagnet 20 need not be energized for the actuator 6 to be introduced into the first housing 2.

The locking bar 20 may additionally be provided with a release element 32 which interacts with a mating element 33 in order to indicate, to the evaluation device 19, the closed or open state of the locking bar 20. The release element 32 may be, in particular, a permanent magnet, while the mating element 33 is a reed contact or Hall-effect sensor which can be actuated by said permanent magnet.

Figure 10:
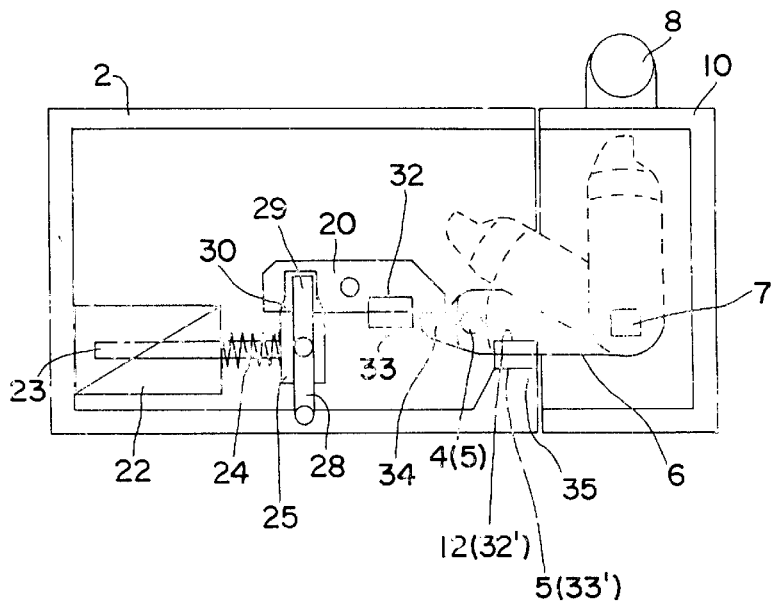
FIG. 10 is a schematic, sectional view of the safety switch of FIG. 9, showing the safety switch in the locking position.

A corresponding arrangement of a release element 32 and of an associated mating element 33 may also be provided in the other embodiments of the safety switch, as is shown, for example, in FIGS. 9 and 10.

Instead of the pivotable locking bar 20, it is also possible to provide a locking bar which can be displaced counter to a spring, in a direction perpendicular to that of the actuator 6, out of the way of the actuator 6, as the latter is pushed into the first housing 2, by the interaction of corresponding oblique surfaces on the actuator 6 and the extension 18 thereof, said locking bar dropping in behind the extension 18 on account of its spring biasing. The release can take place here, in turn, by way of attraction via the electromagnet 22.

In the embodiment illustrated in FIGS. 9 and 10, the actuator 6 can be pivoted through an angle of approximately 90° by means of the handle 8 and provided with a groove 11, as in the embodiment of FIGS. 1 and 2, and with a nose 34 at its free end. The locking pin 4, which interacts with the groove 11, and a protrusion 35, which serves, if appropriate, as a stop for the actuator 6, are provided in the first housing 2, the protrusion 35 bearing the read head 5 and the actuator 6 bearing the release mechanism 12.

Here too, in turn, as with the embodiment of FIGS. 7 and 8, the locking bar 20, which can be actuated by the electromagnet 22, is provided, said locking bar interacting with the nose 34 of the actuator 6 in order to lock the locking bar 20 in the first housing 2. In this case, the locking bar 20 is articulated approximately centrally in the first housing 2 and does not require a separate restoring spring such as the compression spring 21 of the lever 20, articulated at one end, from the embodiment of FIGS. 7 and 8. In this case, in turn, the locking position of the locking bar 20 is monitored by the release element 32 and the mating element 33 provided in the first housing 2.

It is also possible in this embodiment, as with FIGS. 1 and 2, for the read head 5 to be arranged on the locking pin 4 and for the release mechanism 12 to be arranged on the base of the groove 11, while the protrusion 35 and the actuator 6 additionally bear a release element 32' and a mating element 33', for example the actuator 6 bears a permanent magnet and the protrusion 35 bears a reed contact or Hall-effect sensor, in order to ensure double-redundancy monitoring.

However, the latter may also be provided by the respective embodiments making use, on the one hand, of a release mechanism 12 (transponder) together with a release element 32' (permanent magnet) operating by a physical principle other than that of the release mechanism 12 and, on the other hand, of a read head 5 for the release mechanism 12 and a mating element 33' (reed contact, Hall-effect sensor) which can be released by the release element 32', these forming, in particular, structural units.

Figure 11:
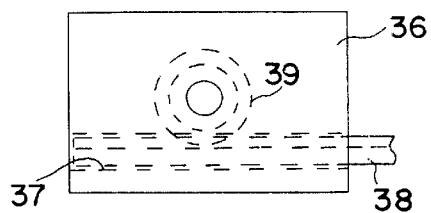
FIG. 11 is a schematic, sectional view of an embodiment of an unlocking device for a safety switch in accordance with the invention.

Instead of an electromagnet 22, it is also possible to use an electric motor 36 (stepping motor), see FIG. 11, of which the housing has a guide 37 for a rack 38, which is connected to the receiving element 25 instead of the armature 23, see FIGS. 7, 8 and 9, 10, and is in engagement with a pinion 39 which can be driven by the electric motor 36 in the housing thereof. It is expedient in this case to have, in particular, an electric motor 36 which automatically moves back into its starting position. Despite a slight amount of heat being generated by the electric motor 36, this makes it possible to achieve a greater retaining force than with an electromagnet 22.

While the invention has been shown and described with reference to preferred embodiments, it should be apparent to one ordinary skilled in the art that many changes and modifications may be made without departing from the spirit and scope of the invention as defined in the claims.

What is claimed is:

1. A monitoring device for a protected area of a machinery installation, the protected area being accessible through at least one access opening which can be closed off by a movable element which is movable between an open position and a closed position, the monitoring device comprising a safety switch having:

a housing arranged adjacent to the movable element, the housing defining a receiving space;

an evaluation device disposed within the housing;

an actuator mounted on the movable element, the actuator being pivotally movable in a pivoting direction between a locking position and an unlocking position, having an end portion received within the receiving space of the housing when the actuator is in the locking position, and defining a groove which extends in the pivoting direction;

handle means for moving the actuator between the locking and unlocking positions;

a coded release mechanism mounted on the end portion of the actuator;

read head means positioned within the housing for reading data stored in the coded release mechanism when the actuator is in the locking position; and a locking pin arranged in the receiving space of the housing;

wherein the groove of the actuator receives the locking pin when the actuator is in the locking position.

2. The monitoring device of claim 1, wherein the actuator is pivotable through a predetermined angle via the handle.

3. The monitoring device according to claim 1, wherein the actuator is displaceable in a longitudinal direction.

4. The monitoring device of claim 1, wherein the actuator is lockable in the locking position.

5. The monitoring device of claim 4, wherein the coded release mechanism is disposed on the base of the groove and the read head is disposed on the locking pin.

6. The monitoring device of claim 4, wherein the safety switch further has a locking bar disposed within the housing, the locking bar being engageable with the actuator.

7. The monitoring device of claim 6, wherein the locking bar is movable between a locked and an unlocked position and the safety switch further has electrical means for moving the locking bar from the locked position to the unlocked position.

8. The monitoring device of claim 6, wherein the locking bar is pivotably or displaceably arranged in the housing.

9. The monitoring device of claim 6, wherein the locking bar is movable between a locked and an unlocked position and the actuator is movable over the locking bar when the locking bar is in the locked position, as the actuator moves from the unlocking position to the locking position.

10. The monitoring device of claim 7, wherein the electrical means is de-energized when the locking bar is in the locked position.

11. The monitoring device of claim 10, wherein the electrical means is deenergizable by the read head means being in the presence of a correctly coded release mechanism.

12. The monitoring device of claim 6, wherein the locking bar has a release element which indicates the position of the locking bar and which interacts with a mating element in the housing.

13. The monitoring device of claim 1, wherein the actuator has a release element which indicates when the actuator is in the locking position and which interacts with a mating element in the housing.

14. The monitoring device of claim 12, wherein the release element is a permanent magnet and the mating element is a sensor which responds to the release element.

15. The monitoring device of claim 13, wherein the release mechanism and the release element as well as the read head and the mating element are assembled to form a structural unit.

16. The monitoring device of claim 2, wherein the actuator is pivotable through an angle of approximately 90°.

17. The monitoring device of claim 7, wherein the electrical means comprises an electromagnet or an electric motor.

18. The monitoring device of claim 14, wherein the mating element is a reed contact or Hall-effect sensor.

* * * * *

UNITED STATES PATENT AND TRADEMARK OFFICE
CERTIFICATE OF CORRECTION

PATENT NO. : 6,539,760 B1
DATED : April 1, 2003
INVENTOR(S) : Letzel et al.

It is certified that error appears in the above-identified patent and that said Letters Patent is hereby corrected as shown below:

Title page,
Delete:
"Related U.S. Application Data
[63]  Continuation-in-part of application no. 09/317,338, filed on May 24, 1999, now Pat. No. 6,283,514

[30]  Foreign Application Priority Data
Jul. 22, 1999 (DE)……………………..199 34 370"

Signed and Sealed this

Twentieth Day of July, 2004

JON W. DUDAS
*Acting Director of the United States Patent and Trademark Office*